US 6,667,208 B2

United States Patent
Oh et al.

(10) Patent No.: US 6,667,208 B2
(45) Date of Patent: Dec. 23, 2003

(54) METHOD FOR MANUFACTURING A CAPACITOR LOWER ELECTRODE OVER A TRANSISTOR AND A BIT LINE CORRESPONDING TO A CELL AREA OF A SEMICONDUCTOR DEVICE

(75) Inventors: Sang-ryong Oh, Icheon-shi (KR); Jung-guk Kim, Icheon-shi (KR); Jin-ho Park, Sungbuk-gu (KR); Ki-won Nam, Gyunggi-do (KR)

(73) Assignee: Hynix Semiconductor Inc, Gyunggi-Do (KR)

( * ) Notice: Subject to any disclaimer, the term of this patent is extended or adjusted under 35 U.S.C. 154(b) by 0 days.

(21) Appl. No.: 10/184,575

(22) Filed: Jun. 28, 2002

(65) Prior Publication Data

US 2003/0013251 A1 Jan. 16, 2003

(30) Foreign Application Priority Data

Jun. 29, 2001 (KR) ........................................ 2001-38497

(51) Int. Cl.$^7$ ........................................... H01L 21/8242
(52) U.S. Cl. ........................ 438/244; 438/253; 438/387; 438/396
(58) Field of Search .................................. 438/241, 244, 438/253, 275, 387, 396; 257/303, 306, 365

(56) References Cited

U.S. PATENT DOCUMENTS

| 5,508,218 A | | 4/1996 | Jun |
| 5,670,806 A | | 9/1997 | Jun |
| 5,770,484 A | | 6/1998 | Kleinhenz |
| 5,789,289 A | * | 8/1998 | Jeng ............................ 438/253 |
| 5,793,077 A | | 8/1998 | Tseng |
| 5,893,734 A | * | 4/1999 | Jeng et al. ................... 438/239 |
| 5,895,250 A | * | 4/1999 | Wu ............................. 438/396 |
| 6,069,038 A | * | 5/2000 | Hashimoto et al. .......... 438/241 |
| 2001/0035552 A1 | * | 11/2001 | Onishi ......................... 257/310 |

* cited by examiner

Primary Examiner—Wael Fahmy
Assistant Examiner—Stephen W. Smoot
(74) Attorney, Agent, or Firm—Marshall, Gerstein & Borun LLP

(57) ABSTRACT

Disclosed is method for manufacturing a semiconductor device, wherein a photosensitive layer and a natural oxidation layer on a cell area and a peripheral circuit area are removed by dry etching while a capacitor of a DRAM device is manufactured, and a polysilicon layer which is not used in the following process is removed by controlling the composition ratio of $CF_4$ gas and $O_2$ gas and the change of pressure and electrical power in two steps so as to reduce the etching selection ratio of the photosensitive layer and the natural oxidation layer with respect to the polysilicon, whereby the remaining polysilicon is prevented regardless of the etching time and etching amount.

8 Claims, 2 Drawing Sheets

METHOD FOR MANUFACTURING A CAPACITOR LOWER ELECTRODE OVER A TRANSISTOR AND A BIT LINE CORRESPONDING TO A CELL AREA OF A SEMICONDUCTOR DEVICE

BACKGROUND

1. Technical Field

A method for manufacturing a semiconductor device is disclosed, and more particularly, a method for manufacturing a semiconductor device is disclosed in which the forming of the lower electrode of a capacitor is improved which, in turn, improves the subsequent process steps required to complete the formation of the capacitor.

2. Description of the Related Art

A memory device such as a dynamic random access memory DRAM, has greater integration than other kinds of memory devices. As the integration of these and other semiconductor devices increases, the design rule becomes more minute and a higher processing technique is required.

The cell of the DRAM basically comprises a transistor and a capacitor. The capacitor is the means for storing information, and a large capacitance per unit area is required.

Moreover, since reliability when storing information has to be guaranteed, undesirable phenomena such as current leakage caused by residual polysilicon should be reduced as much as possible as explained below in reference to FIGS. 1 and 2.

FIG. 1 is a cross sectional view of a semiconductor device, which illustrates the conventional method for manufacturing a semiconductor device.

As shown in FIG. 1, a nitride layer 16 and an oxide layer 17 for forming a capacitor are deposited on the bit lines of a semiconductor device formed with transistors and the bit lines on a cell area A and a peripheral circuit area B. Then, an area on which to form a capacitor is defined on the cell area A, and a polysilicon layer 18 for forming a lower electrode of the capacitor is deposited on the entire construction.

Then, the polysilicon layer 18 for forming the lower electrode of the capacitor on the peripheral circuit area B is etched, wherein the etching gas is a mixture of $CF_4$ gas of about 300 sccm and $O_2$ gas of about 100 sccm, the temperature is about 10° C., the pressure is about 400 mTorr, and the electrical power of high frequency for generating plasma is about 700 W.

In such a situation, a natural oxidation layer 19 formed by the etching gas may remain on the lower portion of the peripheral circuit area B, and the remaining natural oxidation layer 19 functions as an anti-etching layer causing residual polysilicon layer 18 on the undesirable portion as shown in FIG. 1.

As a result, the remaining polysilicon layer 18 causes defects during subsequent process steps where the oxidation layer for forming the capacitor is removed by wet etching.

If the etching is performed excessively in removing the natural oxidation layer 19 on the peripheral circuit area B, the etching time increases. Moreover, in such a situation, the polysilicon layer 18 for forming the lower electrode may be etched together with the photosensitive layer on the cell area A, which results in the decrease in the height of the lower electrode and a reduction of the capacitance of the capacitor.

SUMMARY OF THE DISCLOSURE

A method for manufacturing a semiconductor device is disclosed, in which a photosensitive layer and a natural oxidation layer on a cell area and a peripheral circuit area are removed by dry etching while a capacitor of a DRAM device is manufactured, and a polysilicon layer which is not used in the following process is removed by controlling the composition ratio of $CF_4$ gas and $O_2$ gas and the change in pressure and electrical power in two steps so as to reduce the etching selection ratio of the photosensitive layer and the natural oxidation layer with respect to the polysilicon, whereby residual polysilicon is prevented regardless of the etching time and etching amount.

A method for forming a semiconductor device is disclosed which comprises: preparing a semiconductor device formed with a transistor and a bit line on the cell area and peripheral circuit area; depositing a nitride layer and an oxide layer for forming a capacitor on the bit line; defining a part to form a capacitor on the cell area, and depositing a polysilicon layer for forming a lower electrode of the capacitor on an entire construction; depositing a photosensitive layer on the cell area, and performing a multiple isotropic etching on the polysilicon layer for forming the lower electrode of the capacitor on the peripheral circuit area with a mixture of $CF_4$ gas and $O_2$ gas; depositing a gap-fill oxide layer on the entire construction, and performing a chemical and mechanical polishing to leave the gap-fill oxide layer only on a gap portion of the polysilicon layer for forming the lower electrode of the capacitor on the cell area; and forming the lower electrode of the capacitor by etching an overall exposed part of the polysilicon layer.

In performing the two steps of etching of the polysilicon layer for forming the lower electrode of the capacitor on the peripheral circuit area with the mixture of $CF_4$ gas and $O_2$ gas, the first etching step is performed with the mixture of $CF_4$ gas and $O_2$ gas of a ratio is in the range of 0.8–1.2:0.8–1.2, for about 30 seconds at a temperature ranging from about 30° C. to about 40° C. and at a pressure ranging from about 800 mTorr to about 900 mTorr, by supplying an electrical power of high frequency ranging from about 800 W to about 900 W, and the second etching step is performed with the mixture of $CF_4$ gas and $O_2$ gas of a ratio in the range 4.5–5.5:1.2–2.5, for about 45 seconds at a temperature ranging from about 30° C. to about 40° C. and at a pressure ranging from about 350 mTorr to about 450 mTorr, by supplying an electrical power of high frequency ranging from about 600 W to about 700 W. Then, the etching selection ratio in regard to the polysilicon for forming the lower electrode of the capacitor on the peripheral circuit area B, the natural oxidation layer (not shown), and the photosensitive layer 130 becomes 7–7.6:0.8–1.2:2.8–3.3.

BRIEF DESCRIPTION OF THE DRAWINGS

Other objects and aspects of the disclosure will become apparent from the following description of the disclosed embodiment with reference to the accompanying drawings wherein.

DETAILED DESCRIPTION OF THE PRESENTLY PREFERRED EMBODIMENTS

Figure 1:
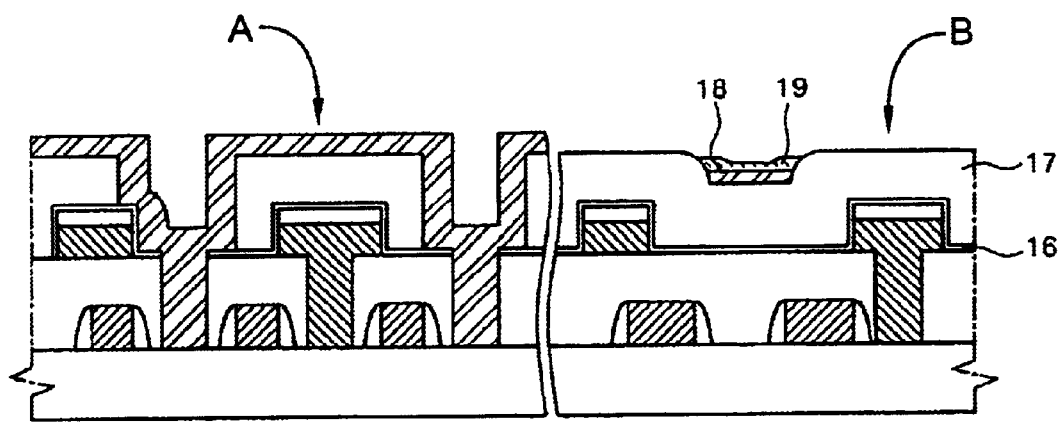
FIG. 1 is a cross sectional view of a semiconductor device illustrating a conventional method for manufacturing the semiconductor device.

Hereinafter, the disclosed methods will be described in more detail referring to the drawings.

Figure 2A:
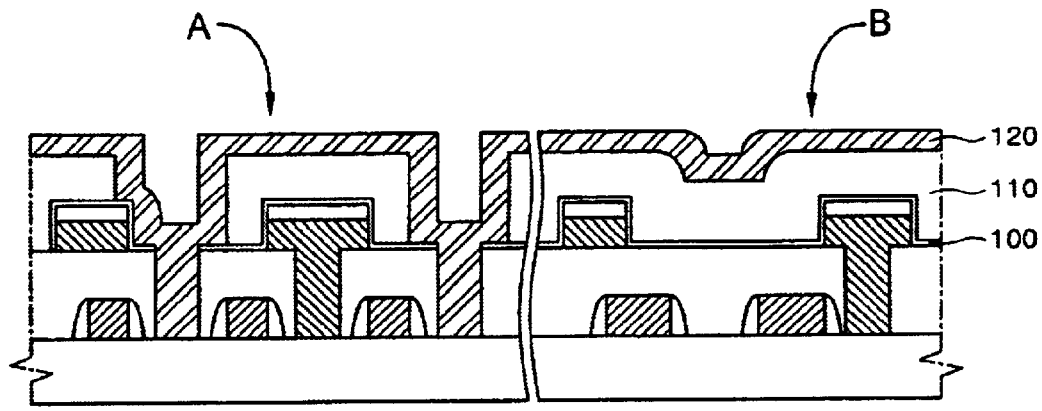
FIGS. 2A to 2C are sectional views illustrating a disclosed method for manufacturing a semiconductor device.
Figure 2B:
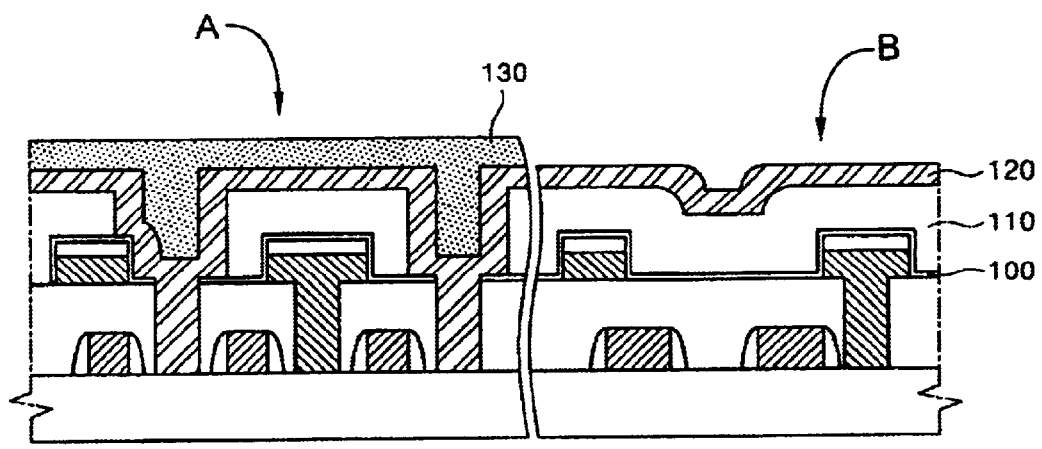
Figure 2C:
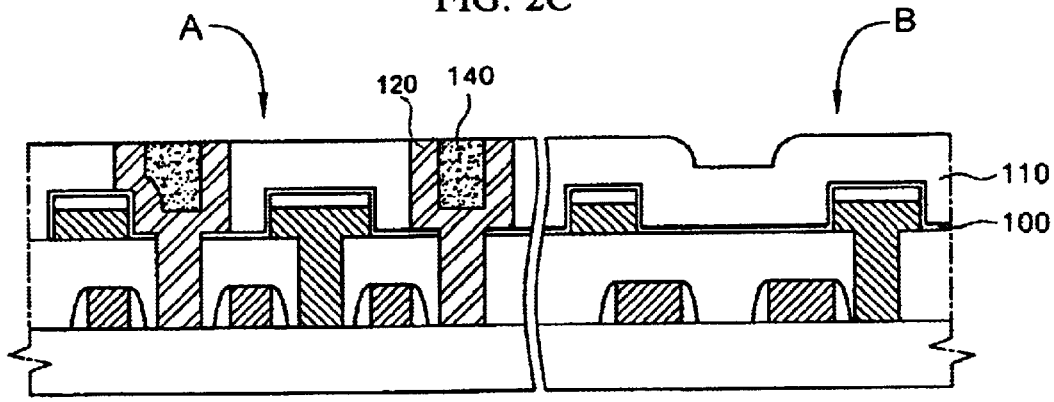

FIGS. 2A to 2C are cross sectional views consecutively showing the disclosed methods for manufacturing a semiconductor device.

As shown in FIG. 2A, a nitride layer 100 and an oxide layer 110 for forming a capacitor on a bit line of a semiconductor device are deposited on the semiconductor device formed with a transistor and the bit line on a cell area A and a peripheral circuit area B. Then, a part forming a capacitor is defined on the cell area A, and a polysilicon layer 120 for forming a lower electrode of the capacitor is deposited on the entire structure.

Then, as shown in FIG. 2B, a photosensitive layer 130 is deposited on the cell area A, and a multiple etching comprised of two steps of isotropic etchings is performed on the polysilicon layer 120 for forming the lower electrode of the capacitor on a peripheral circuit area B with a mixture of $CF_4$ gas and $O_2$ gas while controlling the composition ratio thereof. In this situation, the overall flow rate of the mixture ranges from about 500 sccm to about 1000 sccm. The isotropic etching may be performed using a downstream method using a microwave RF power.

During the dry etching, an undesirable natural oxidation layer (not shown) is generated on the polysilicon layer 120 for forming the lower electrode, so that the etching is performed in consideration of the etching selection ratio of the photosensitive layer 130, the natural oxidation layer (not shown), and the polysilicon layer 120 for forming the lower electrode of the capacitor on the peripheral circuit area B.

Therefore, the first etching step is performed with the mixture of $CF_4$ gas and $O_2$ gas with a composition ratio in the range 0.8–1.2:0.8–1.2, for about 30 seconds at a temperature ranging from about 30° C. to about 40° C. and at a pressure ranging from about 800 mTorr to about 900 mTorr, by supplying an electrical power of high frequency ranging from about 800 W to about 900 W, and the second etching step is performed with the mixture of $CF_4$ gas and $O_2$ gas of which the composition ratio is in the range 4.5–5.5:1.2–2.5, for about 45 seconds at a temperature ranging from about 30° C. to about 40° C. and at a pressure ranging from about 350 mTorr to about 450 mTorr, by supplying an electrical power of high frequency ranging from about 600 W to about 700 W. Then, the etching selection ratio in regard to the polysilicon layer 120 for forming the lower electrode of the capacitor on the peripheral circuit area B, the natural oxidation layer (not shown), and the photosensitive layer 130 becomes 7–7.6:0.8–1.2:2.8–3.3, whereby the photosensitive layer 130 and the natural oxidation layer (not shown) can be removed completely.

Furthermore, the etching rate of the polysilicon layer 120 for forming the lower electrode of the capacitor can be maintained at over 2500 picometers/min, which improves its productivity.

Therefore, according to the above process, the thickness of the polysilicon layer 120 for forming the lower electrode of the capacitor becomes 4996 picometers, the thickness of the natural oxidation layer (not shown) becomes 431 picometers, and the thickness of the photosensitive layer 130 becomes 745 picometers.

Next, as shown in FIG. 2C, a gap-fill oxide layer 140 is deposited on the entire construction, and chemical and mechanical polishing (CMP) is performed thereby leaving the gap-fill oxide layer 140 only on a gap portion of the polysilicon layer 120 for forming the lower electrode of the capacitor on the cell area A.

After that, the lower electrode of the capacitor is formed by etching the overall exposed part of the polysilicon layer 120 for forming the lower electrode of the capacitor.

Therefore, the defect of the semiconductor device on the wafer is reduced, and the productivity of the semiconductor device increases.

According to the disclosed method for forming a semiconductor device, the photosensitive layer and the natural oxidation layer on the cell area and the peripheral circuit area are removed by dry etching while the capacitor of a DRAM device is manufactured, and the polysilicon layer which is not used in the following process is removed by controlling the composition ratio of $CF_4$ gas and $O_2$ gas and the change in the pressure and electrical power in two steps so as to reduce the etching selection ratio of the photosensitive layer and the natural oxidation layer with respect to the polysilicon, whereby the remaining polysilicon is prevented regardless of the etching time and etching amount.

What is claimed is:

1. A method for forming a semiconductor device comprising:

preparing a semiconductor device comprising a transistor and a bit line disposed on a cell area and a peripheral circuit area of the semiconductor device;

depositing a nitride layer and an oxide layer for forming a capacitor on the bit line;

depositing a polysilicon layer for forming a lower electrode of the capacitor on the cell and peripheral circuit areas;

depositing a photosensitive layer on the cell area, and performing a multiple isotropic etching of the photosensitive layer and a portion of the polysilicon layer on the peripheral circuit area with a mixture of $CF_4$ gas and O2 gas;

depositing a gap-fill oxide layer on the cell and peripheral circuit areas, and performing chemical and mechanical polishing thereby leaving the gap-fill oxide layer only in a gap portion of the polysilicon layer disposed on the cell area leaving exposed portions of the polysilicon layer; and forming the lower electrode of the capacitor by etching exposed portions of the polysilicon layer.

2. The method for forming a semiconductor device of claim 1, wherein the isotropic etching is performed by a downstream method using a microwave RF power.

3. The method for forming a semiconductor device of claim 1, wherein the multiple etching is performed in two steps by controlling a ratio and a pressure of a mixture $CF_4$ gas and $O_2$ gas, and by controlling a time period of the etching.

4. The method for forming a semiconductor device of claim 3, wherein the ratio of the $CF_4$ gas and $O_2$ gas is 0.8–1.2:0.8–1.2 in a first etching step and 4.5–5.5:1.5–2.5 in a second etching step, and a flow rate of the mixture ranges from about 500 sccm to about 1000 sccm.

5. The method for forming a semiconductor device of claim 3, wherein, for the first etching step, a temperature ranging from about 30° C. to about 40° C., a pressure ranging from about 800 mTorr to about 900 mTorr, and a high frequency electrical power ranging from about 800 W to about 900 W are utilized.

6. The method for forming a semiconductor device of claim 3, wherein, for the second etching step, a temperature ranging from about 30° C. to about 40° C., a pressure ranging from about 350 mTorr to about 450 mTorr, and a high frequency electrical power ranging from about 600 W to about 700 W are utilized.

7. The method for forming a semiconductor device of claim 1, wherein, in the multiple etching, the etching selection ratio of the polysilicon layer for forming the lower electrode, a natural oxidation layer disposed thereon, and the photosensitive layer is 7–7.6:0.8–1.2:2.8–3.3.

8. The method for forming a semiconductor device of claim 1, wherein, for the multiple etching, etching time is about 30 seconds for a first etching step and about 45 seconds for a second etching step.

* * * * *

UNITED STATES PATENT AND TRADEMARK OFFICE
CERTIFICATE OF CORRECTION

PATENT NO. : 6,667,208 B2
DATED : December 23, 2003
INVENTOR(S) : Sang-Ryong Oh et al.

It is certified that error appears in the above-identified patent and that said Letters Patent is hereby corrected as shown below:

<u>Title page,</u>
Item [75], Inventors, please delete "Icheon-shi" and replace with -- Gyunggi-do -- in both instances; and please delete "Sungbuk-gu" and replace with -- Seoul-shi --.

<u>Column 4,</u>
Line 43, please delete "0.8-1.2:0.8-1.2" and replace with -- 0.8~1.2:0.8~1.2 --.
Line 43, please delete "4.5-5.5:1.5-2.5" and replace with -- 4.5~5.5:1.5~2.5 --.
Line 61, please delete "7-7.6:0.8-1.2:2.8-3.3." and replace with
-- 7~7.6:0.8~1.2:2.8~3.3. --.

Signed and Sealed this

Eleventh Day of May, 2004

JON W. DUDAS
*Acting Director of the United States Patent and Trademark Office*